United States Patent [19]
Adachi

[11] Patent Number: 5,199,110
[45] Date of Patent: Mar. 30, 1993

[54] TRANSMITTING POWER CONTROL CIRCUIT

[75] Inventor: Keigo Adachi, Hyogo, Japan

[73] Assignee: Mitsubishi Denki Kabushiki Kaisha, Tokyo, Japan

[21] Appl. No.: 573,966

[22] Filed: Aug. 28, 1990

[30] Foreign Application Priority Data

Jun. 8, 1990 [JP] Japan .................... 2-150554

[51] Int. Cl.⁵ .................. H01Q 11/12; H04B 1/04
[52] U.S. Cl. .................. 455/126; 455/127; 455/234.1; 379/58
[58] Field of Search .......... 455/95, 126, 127, 115, 455/234, 116; 379/58

[56] References Cited

U.S. PATENT DOCUMENTS

| | | | |
|---|---|---|---|
| 4,523,155 | 6/1985 | Walczak et al. | 330/279 |
| 4,731,869 | 3/1988 | Farrer | 455/127 |
| 5,054,052 | 10/1991 | Nonami | 379/58 |
| 5,086,508 | 2/1992 | Furuno | 455/127 |
| 5,126,686 | 6/1992 | Tam | 455/126 |

Primary Examiner—Reinhard J. Eisenzopf
Assistant Examiner—Christine K. Belzer
Attorney, Agent, or Firm—Rothwell, Figg, Ernst & Kurz

[57] ABSTRACT

A transmitting power control circuit comprising a control unit which recognizes the period of transmitting the voice signal and issues instruction to the reference signal generating unit to output a lower output reference value during such period and a reference value generating unit which has, as the one output reference value, an output reference value corresponding to a lower output level in the higher power level of the adjacent power levels and an output reference value corresponding to a higher output level in the lower power level and prepares, as a result of it, a less number of output reference values and thereby outputs the output reference value during transmission of data signal in each power level and the output reference value during transmission of voice signal.

2 Claims, 10 Drawing Sheets

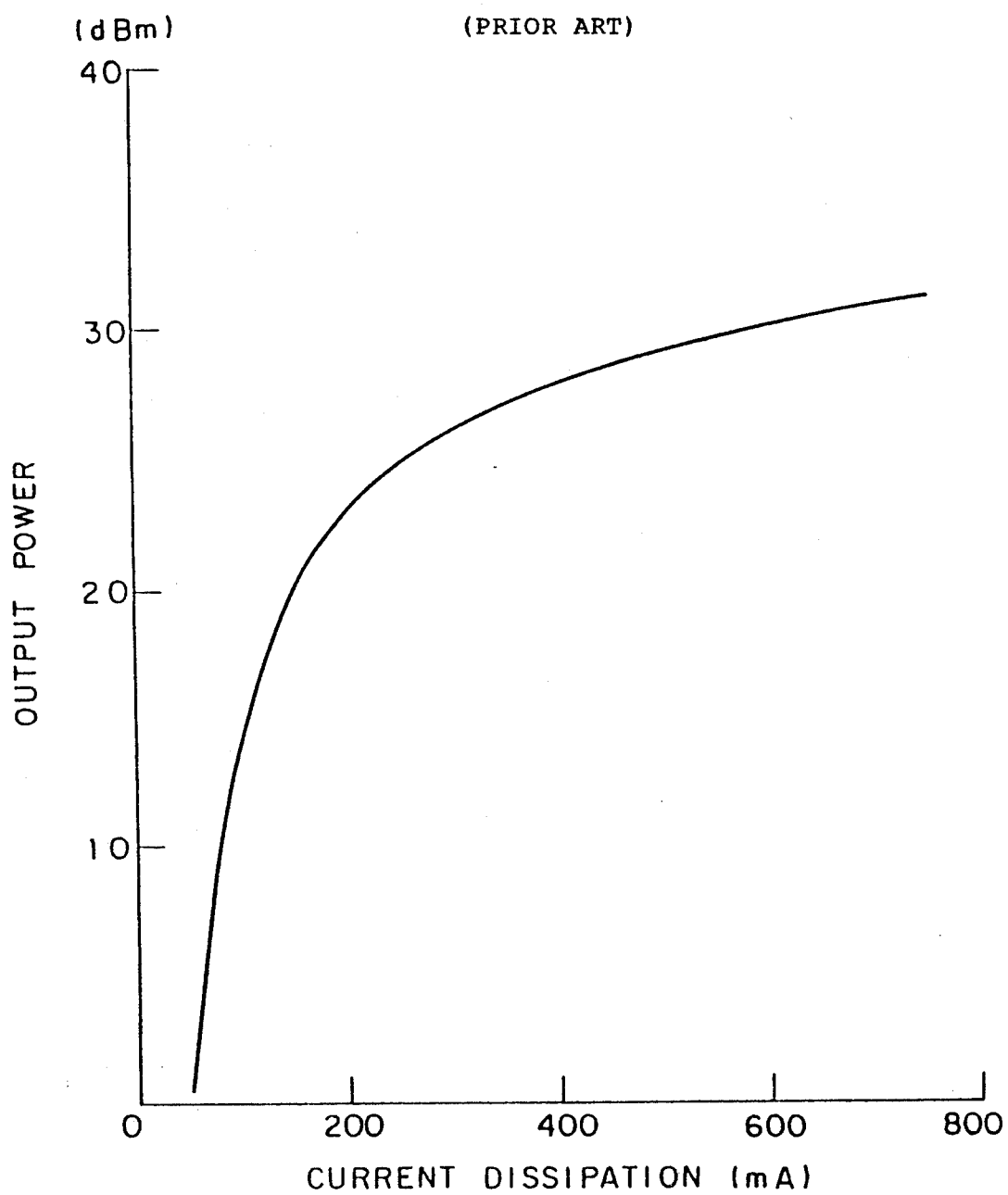

TRANSMITTING POWER CONTROL CIRCUIT

BACKGROUND OF THE INVENTION

1. Field of the Invention

The present invention relates to a transmitting power control circuit for use in a mobile radio equipment or the like for transmitting power at a predetermined value.

2. Prior Art

FIG. 6 is a block diagram indicating a part of transmitting side of a conventional mobile radio equipment. In this figure, the reference numeral 1 denotes a main apparatus of radio equipment; 2, a transmitting output unit for outputting a transmitting signal of the predetermied level; 41, a control unit which controls starting of transmitting output unit 2; 5, an antenna for sending a transmitting signal; 8, a reference signal generator for generating an output reference value. In addition, 21, is a high frequency signal amplifier (hereinafter referred to as amplifier) for amplifying the transmitting signal to the predetermined level in accordance with an instruction signal; 22, is an output level detector for allowing the transmitting signal of the predetermined level to pass and outputting a level signal in accordance with such predetermined level; 23, is a transmitting output control unit for comparing the level signal and output reference value and applying a current depending on difference of such signals to the amplifier 21 as an instruction signal.

Next, operations will be explained. The amplifier 21 amplifies a transmitting signal in accordance with the instruction signal and outputs a transmitting signal of the predetermined level. The amplified transmiting signal is transmitted from the antenna 5. The level of amplified transmitting signal is detected by the output level detector 22. The output level detector 22 outputs a level signal in accordance with the detected level. The transmitting output control unit 23 compares the output reference value input from the reference value generator 8 and level signal and outputs a difference current to the amplifier 21 as the instruction signal. Accordingly, the transmitting output control unit 23 controls the amplifier 21 so that the level signal matches with the reference value. The output level of amplifier 21 is thus kept constant. Moreover, since the level of transmitting signal of a mobile radio equipment is determined depending on the system used, the output reference value is set so that the output level becomes equal to a level in the specified range.

FIG. 7 is a circuit diagram indicating an example of the transmitting output control unit 23. As shown in FIG. 7, the level signal is input to an input terminal 27. Meanwhile, the output reference value is input to the input terminal 28. The comparator 24 generates a voltage depending on a voltage difference of a couple of input voltages Moreover, a base current flows into a transistor 25 depending on such voltage and thereby resultant collector current flows. Next, the collector current of transistor 25 becomes a base current of transistor 26. Therefore, the transistor 26 allows flow of the collector current depending on the collector current of transistor 25. This collector current flows into the output terminal 29 as an instruction signal. As explained above, the transmitting output control unit 23 applies an instruction signal to the amplifier 21 depending on the level signal in order to control an output level of the amplifier 21.

FIG. 8 shows a relationship between power level and output level of a mobile station of the Advanced Mobile Phone Service: AMPS in the USA. In this case, the power level of eight (8) steps (six kinds) is defined. Accordingly, a reference value generator which generates six kinds of output reference value (values depending on the output level indicated by black points in FIG. 8) is required in place of the reference value generating unit 8. Moreover, the control unit 41 issues an instruction to the reference value generating unit 8 to output the output reference value depending on the power level instructed from a base station.

In an ordinary mobile radio communication system, change of field depending on the location of a mobile station, called fading, is generated. FIG. 9 shows an example of the fading. This profile is observed in the side of mobile station, but when a mobile station is moving, similar phenomenon can also be observed in the base station. In FIG. 9, it is assumed that the receivable field level in the receiving side is A. In this case, if the field level changes according to a field distribution as shown by B with variations from the predetermined transmitting level in the transmitting side by fading, reception becomes impossible in some cases. Therefore, it is required in the transmitting side that a signal higher level than such transmitting level is transmitted in order to obtain a higher level field distribution, for example, C in the receiving side. Here, the mobile station transmits the data signal to be used for incoming and outgoing calls and the voice signal. The data signal is required to show the distribution C of receiving field in order to eliminate error but the voice signal is not always required to show such distribution. For instance, if the receiving field distribution B is obtained, voice communication is not disturbed, although a momentary noise is generated during communication.

In the case of mobile radio equipment, a large amount of power is consumed in the amplifier 21. FIG. 10 shows relationship between the output power of amplifier 21 and current dissipation. For example, when the amplifier 21 is operated at an output of 30 dBm, current dissipation is 600 mA. When a battery with capacity of 0.6 Ah is used, it can serve for an hour. When the amplifier is operated in output of 29 dBm, current dissipation is 500 mA and the battery can serve for 1.2 hours. As explained above, the output of the amplifier 21 is set as low as possible within the specified range in order to reduce power consumption but this will result in a problem due to lower output of amplifier 21 in view of preventing errors in of data signals as explained above.

The existing transmitting power control circuit is structured as explained above. Therefore, an output level of amplifier 21 is constant and such constant value is set to a rather higher value in the specified range to allow transmision of data signals. Since the high output level required for transmission of data signals is used also for transmission of voice signals, problems arise in that current dissipation increases, a large capacity battery is required for long term communication and the apparatus becomes large in size.

SUMMARY OF THE INVENTION

The present invention has been proposed to eliminate the problems explained above. It is therefore an object of the present invention to provide a transmitting power control circuit which suppresses power consumption of the apparatus, realizes a long term communication using a small capacity battery and moreover reduces the size of apparatus.

The transmitting power control circuit of the present invention comprises a reference value generating unit for generating an output reference value which is an output level within the specified range and corresponds to a couple of different output levels and a control unit for issuing an instruction to the reference value generating unit to output the output reference value corresponding to a higher output level when the transmitting signal is data signal or to output the output reference value corresponding to a lower output level when the transmitting signal is voice signal.

Moreover, the transmitting power control circuit of the present invention provides control wherein only one of a plurality of power levels (there is an overlapped range in the specified range of adjacent power levels) is designated and the output level is controlled within the specified range of designated power level and comprises a reference value generating unit for generating output reference values corresponding to a plurality of output levels in which each output level includes different high and low levels within the specified range of a plurality of power levels and a lower output level of the higher power level in the adjacent power levels matches with the higher output level in the lower power level and a control unit which issues an instruction to the reference value generating unit to output an output reference value corresponding to the higher output level in the power level when the transmitting signal is data signal or to output an output reference value corresponding to the lower output level of power level when the transmitting signal is voice signal.

BRIEF DESCRIPTION OF THE DRAWINGS

FIG. 10 is a diagram for indicating an example of relationship between current dissipation and output power of the amplifier.

PREFERRED EMBODIMENTS OF THE INVENTION

An embodiment of the present invention will be explained with reference to the accompanying drawings.

Figure 1:
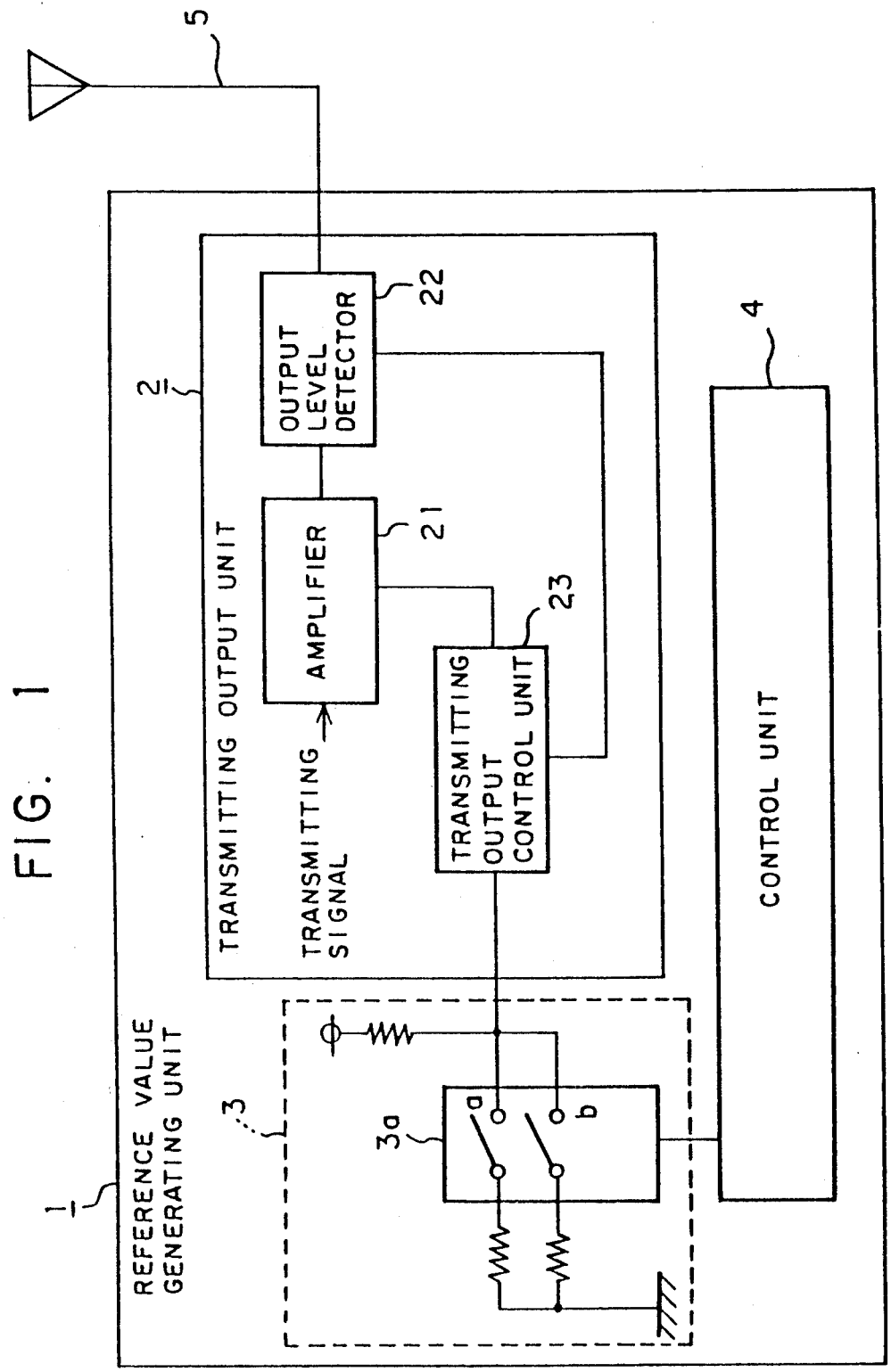
FIG. 1 is a block diagram indicating a mobile radio equipment utilizing the transmitting power control circuit as the first embodiment of the present invention.
Figure 6:
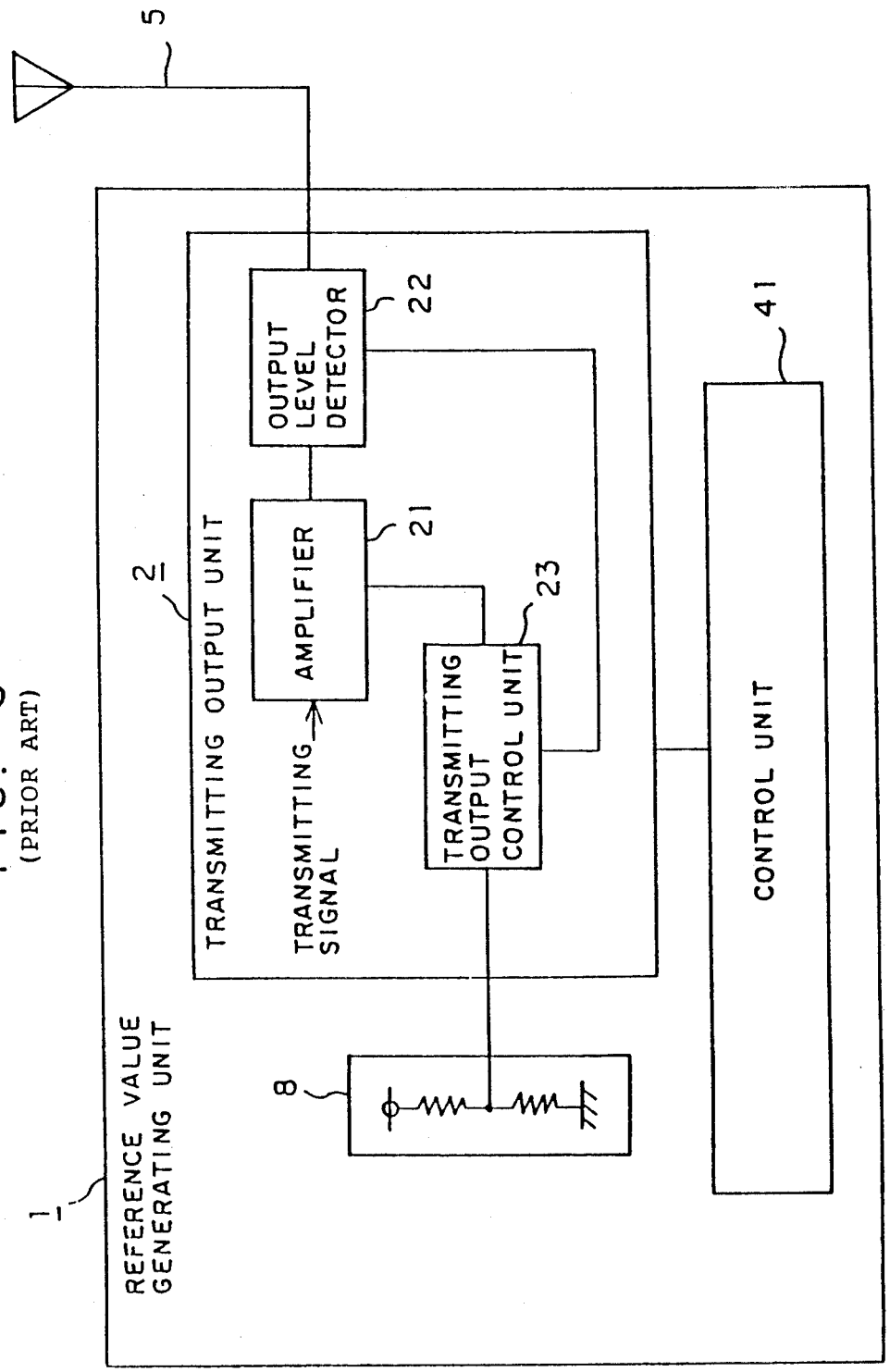
FIG. 6 is a block diagram of a mobile radio equipment utilizing conventional transmitting power control circuit.
Figure 7:
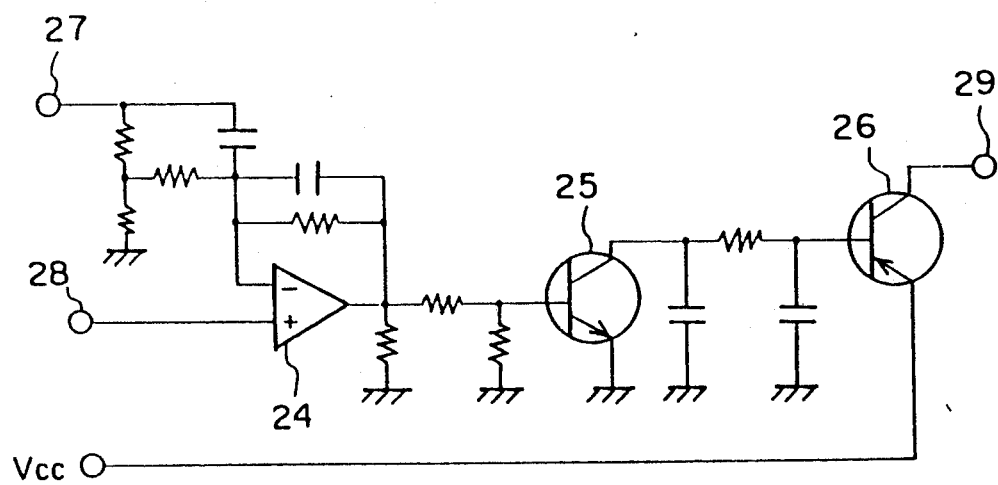
FIG. 7 is a circuit diagram indicating an example of the transmitting output control unit.
Figure 8:
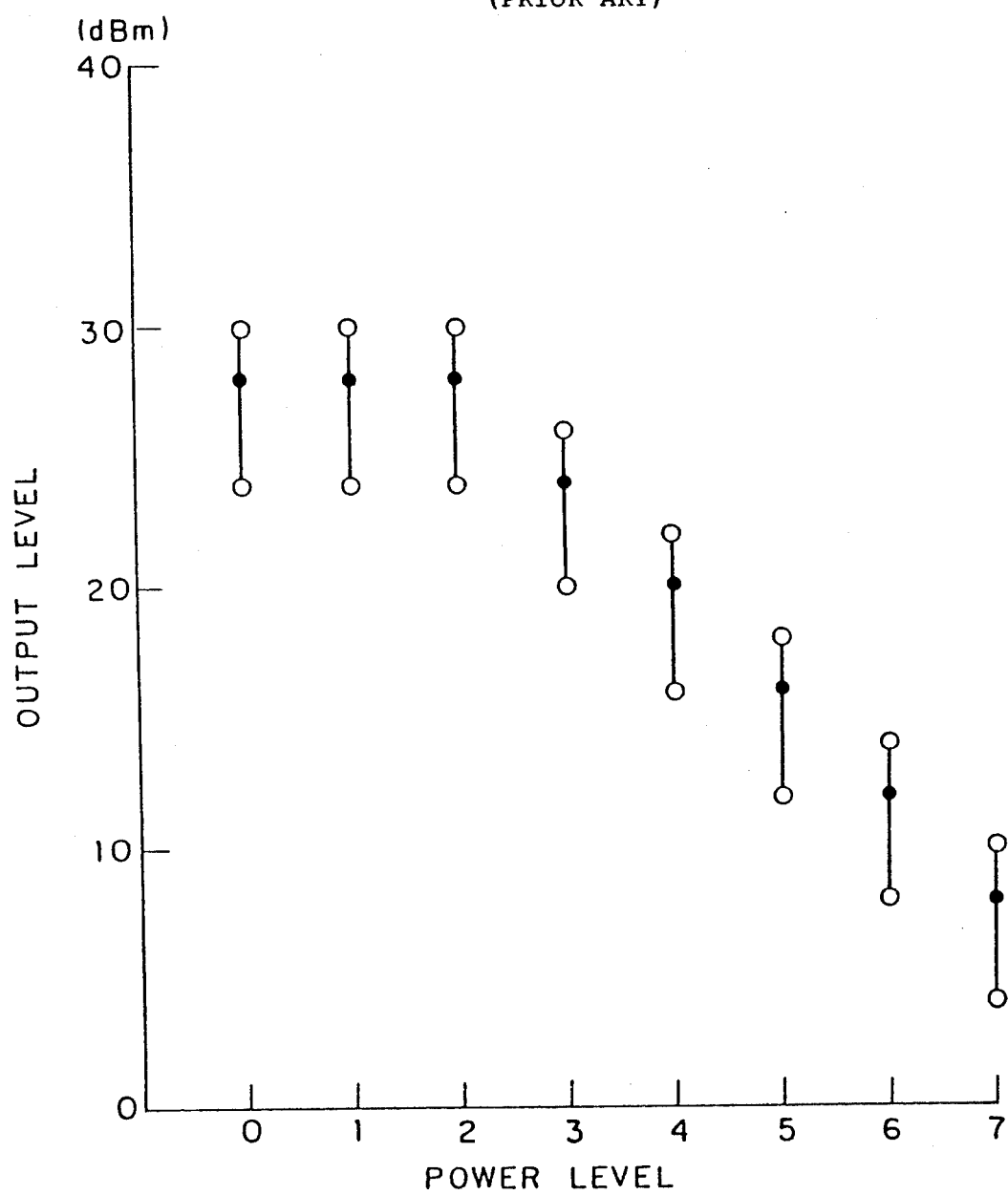
FIG. 8 is a diagram for explaining relationship between power level and output level.
Figure 9:
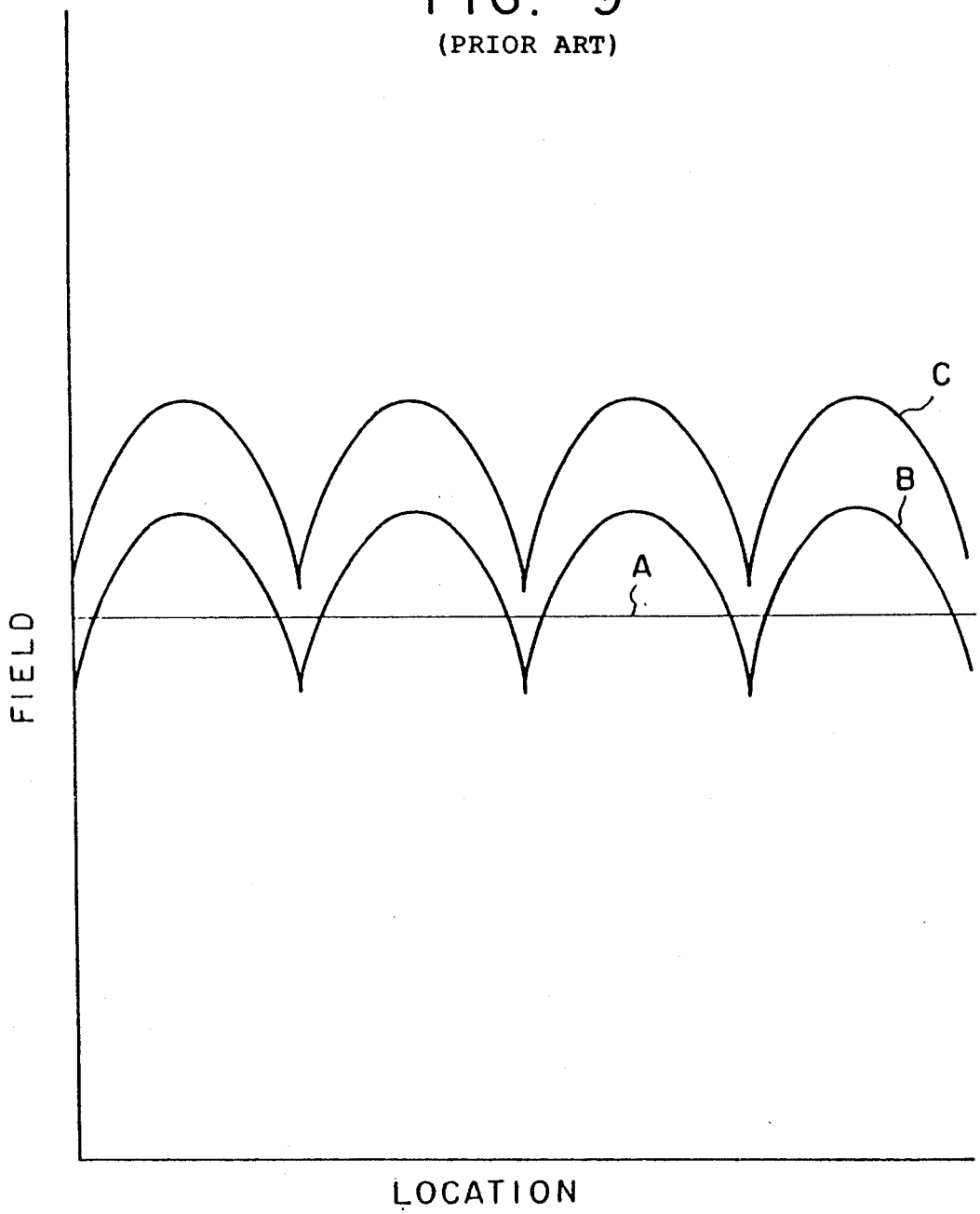
FIG. 9 is a diagram for explaining an example of fading.

In FIG. 1, the reference numeral 3 denotes a reference value generating unit comprising an analog switch 3a having two contacts a, b. The resistance values of respective resistors are preset so that a voltage applied to the transmitting output control unit 23 when the contact a is conductive is higher than the voltage applied to the transmitting output control unit 23 when the contact b is conductive. Both voltages are output reference values and correspond to the values within the specified range of output levels. The reference numeral 4 denotes a control unit which operates as the conventional control unit and applies a switching signal for the switch to the reference value generating unit 3. The other elements are denoted by like reference numerals similar to that shown in FIG. 6.

Figure 2:
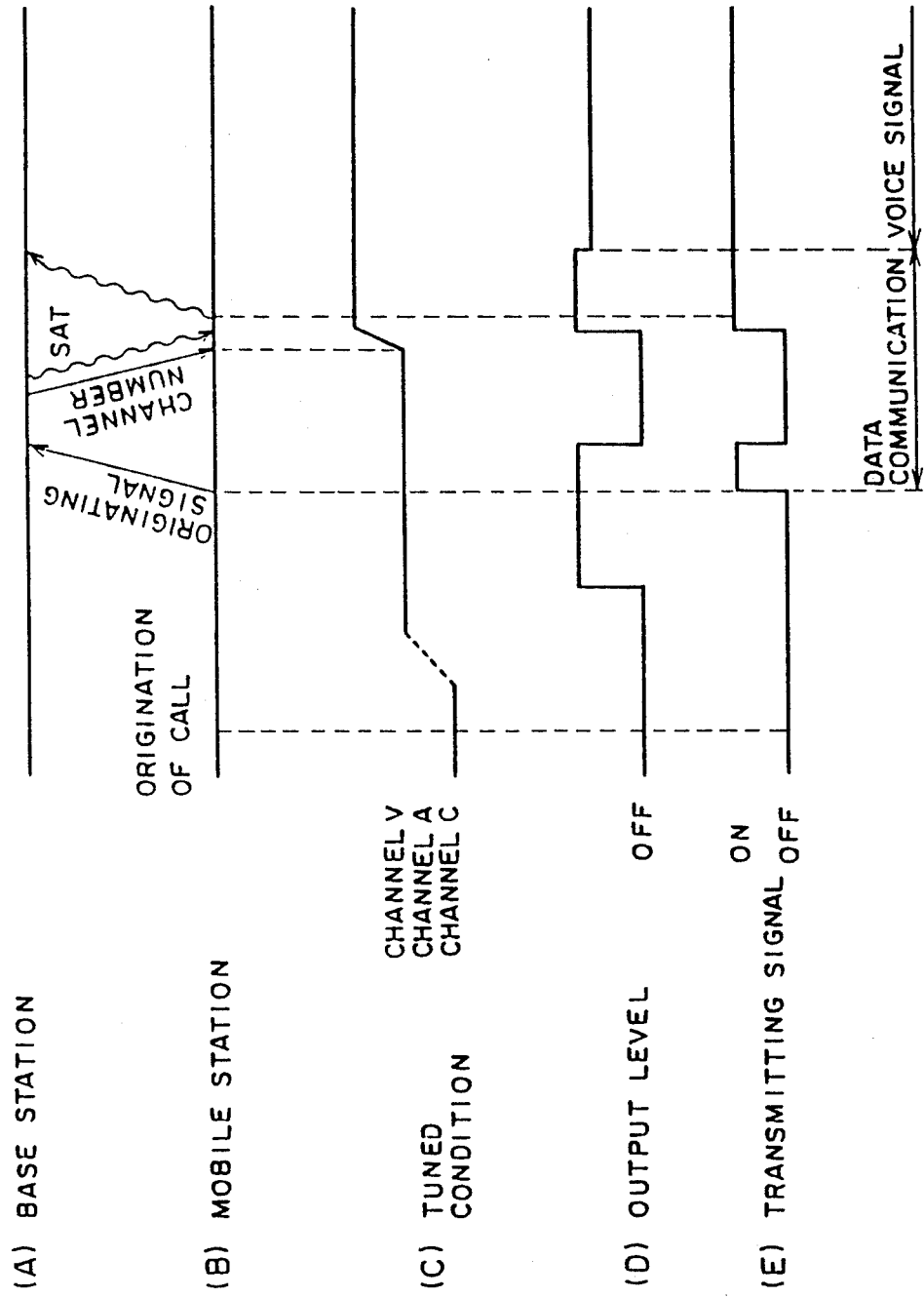
FIG. 2 is a timing diagram indicating switching of the output levels.

Next, operations will be explained with reference to the timing diagram of FIG. 2. In the case of generating an outgoing call, the control unit 4 selects an idle originating call control channel (channel A) based on the receiving level received by the receiver (not illustrated). The control unit 4 applies an originating call signal after tuning the transmitter (not illustrated) to the channel A. The originating call signal is modulated in the transmitter, amplified in the amplifier 21 and is then transmitted from the antenna 5 to the base station. In this case, the control unit 4 gives a switching signal to instruct closing of the contact a to the reference value generating unit 3. Accordingly, the output level is set to a higher level (refer to FIG. 2D). The base station notifies the channel number of communication channel (channel V) to be used, using the channel A. Upon obtaining such channel number through the receiver, the control unit 4 sets both transmitter and receiver to the transmitting condition by the channel V designated. Here, the mobile radio equipment receives a continuity test signal (SAT) from the base station and enters the voice communication condition after returning such SAT to the base station. In this timing, the control unit 4 applies the switching signal to designate release of contact a and closing of contact b of the reference value generating unit 3. Therefore, the voice signal is transmitted with the lower output level (refer to FIG. 2D). As explained above, during the data communication, the transmitting signal has been transmitted with a high output level in the specified range in order to prevent data error by fading but since data communication is carried out only within a short period during the total communication period, the current dissipation can be reduced considering the total period of communication time. For instance, according to the example shown in FIG. 10, the output level is set to 30 dBm during the data signal transmission or to 28 dBm during the voice signal transmission. In the case where the data communication requires 5% of total communication period, a battery in capacity n of 0.6 Ah will realize communication for 1.4 hours. Namely, the communication period can be extended up to 1.4 times longer than the period in transmission of 30 dBm.

Figure 3:
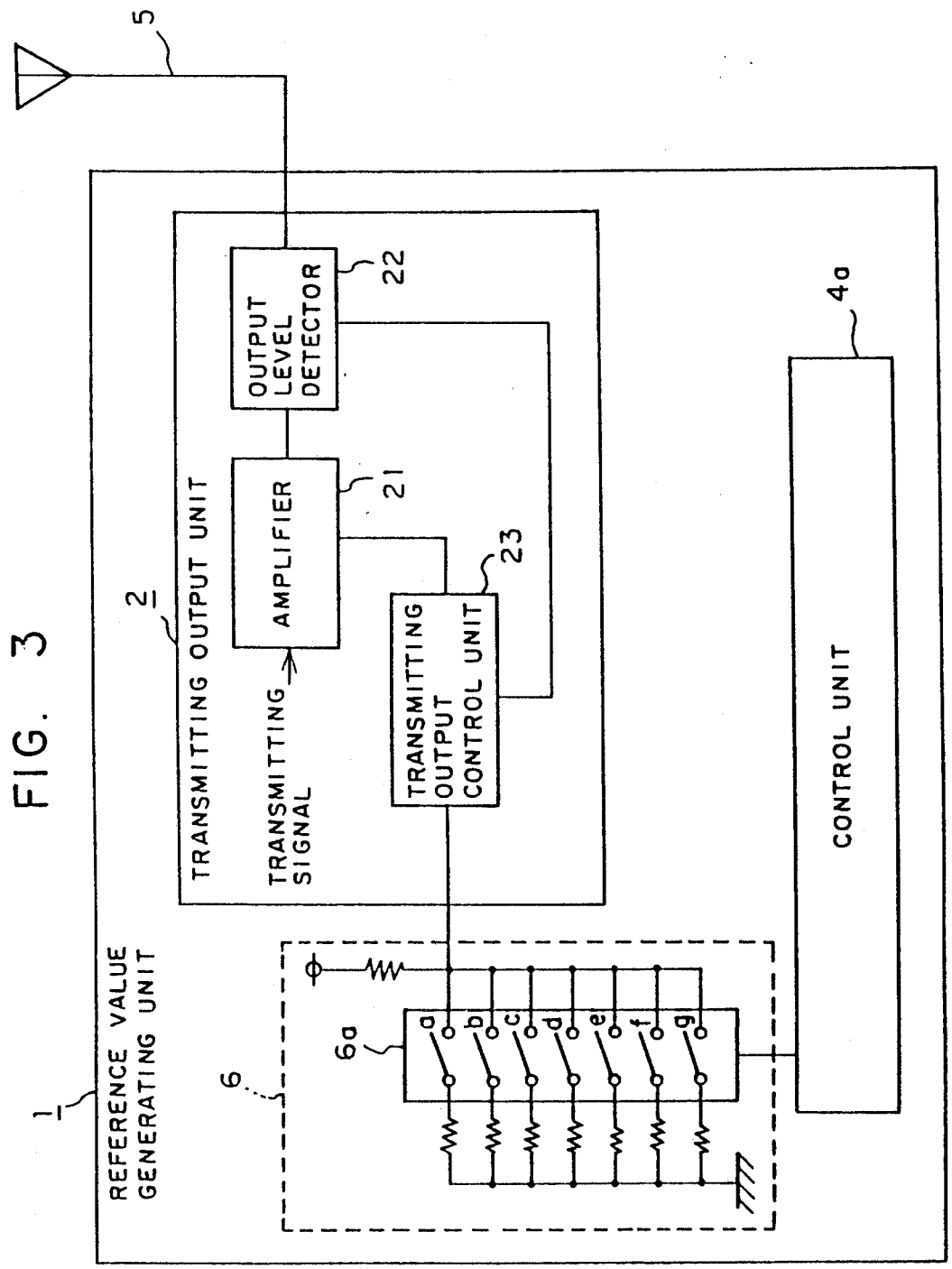
FIG. 3 is a block diagram indicating a mobile radio equipment utilizing the transmitting power control circuit of the second embodiment of the present invention.
Figure 4:
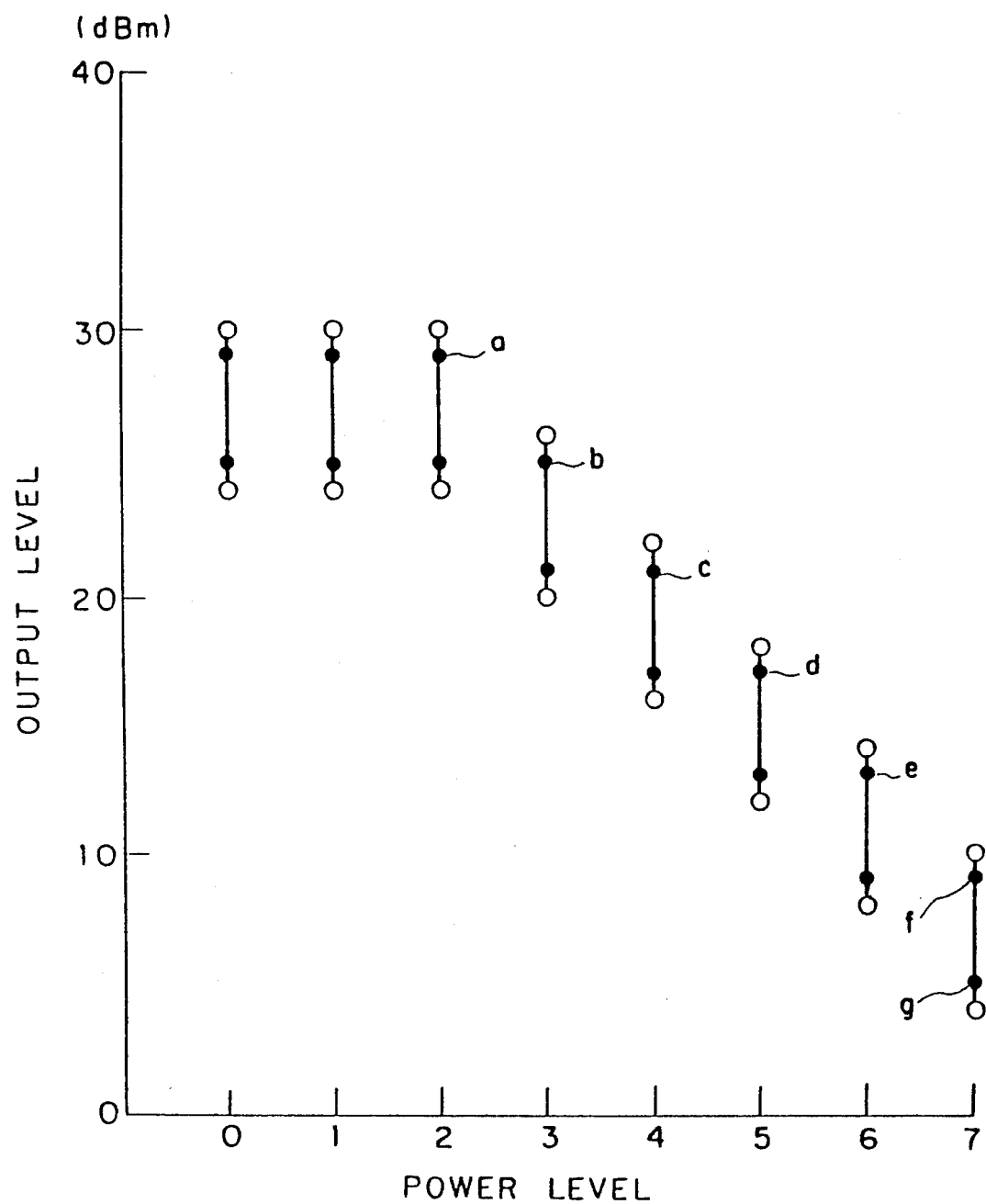
FIG. 4 is a diagram for explaining relationship between power level and output level.

FIG. 3 is a block diagram indicating a mobile radio equipment to be used when a plurality of power levels are used for transmitting signal. In this figure, the reference numeral 6 denotes a reference value output unit comprising an analog switch 6a having seven contacts a–g. FIG. 4 indicates power level of AMPS. The black points indicate output levels used by the mobile radio equipment to which the present embodiment is applied. For example, it is indicated when the second power level is designated from the base station, the data signal is transmitted in the output level of the point a (29 dBm), while the voice signal is transmitted in the output level of point b (25 dBm). In addition, output levels at the points a-g respectively correspond to the points a-g in FIG. 3. Therefore, the resistance values of respective resistors in the reference value generating unit 6 are set to generate output reference values corresponding to the output levels at the points a-g. For example, when the second power level is designated, the control unit 4a applies the switching signal to the reference value generating unit 6 to close the contact a during data signal transmission or close the contact b during voice signal transmission. As explained above, the reference value generating unit 6 having seven contacts a-g has realized setting of the high level corresponding to data signal and low level corresponding to voice signal within the specified range of the six kinds of power levels.

Figure 5:
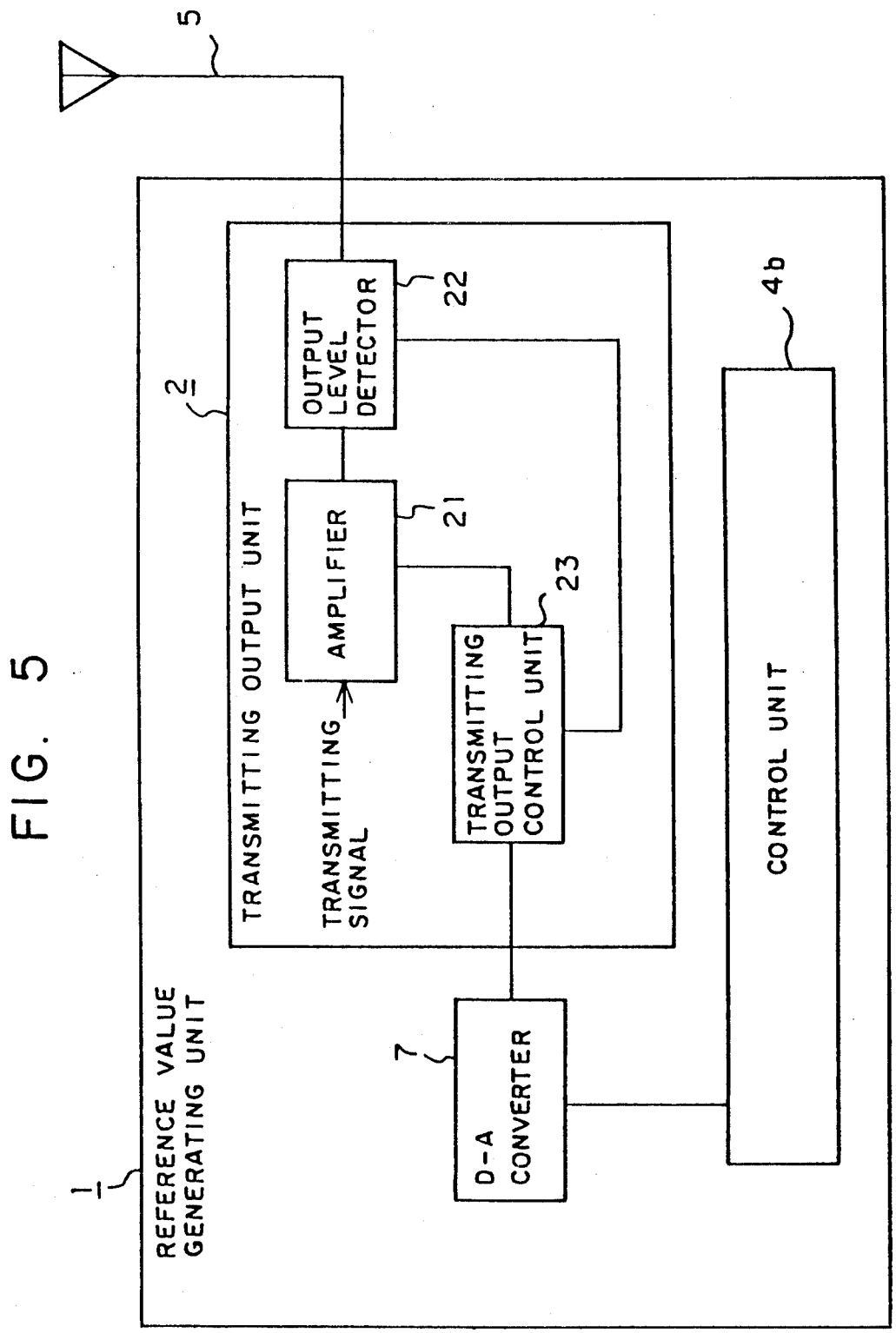
FIG. 5 is a block diagram indicating a mobile radio equipment utilizing the transmitting power control circuit of a third embodiment of the present invention.

In above each embodiment, the analog switches 3a, 6a have been used to generate output reference value but a D-A converter 7 may be provided as shown in FIG. 5. In this case, each output reference value is digitalized in the control unit 4b. The control unit 4b outputs the digital output reference value in the same timing as the output reference value setting timing in the first embodiment or in the second embodiment. The D-A converter 7 outputs the output reference value depending on such digital output reference value to the transmitting output control unit 23. As explained above, the effect which is same as in each embodiment can be realized, circuit structure can also be simplified and the apparatus itself can also be reduced in size.

As described previously, according to the present invention, the transmitting power control circuit comprises a reference value generating unit which generates a couple of output reference values depending on two output levels within the specified range and is structured so that any one output reference value is used depending on the transmission timing of the data signal and voice signal. Accordingly, current dissipation can be reduced and a battery may be used for a long period of time.

In addition, according to the present invention, the transmitting power control circuit comprises a reference value generating unit which generates an output reference value corresponding to a couple of output levels within the specified range of each power level and is used in common with the output level of adjacent power levels and is structured so that any one output reference value is used depending on the transmission timing of the data signal and voice signal. Thereby, current dissipation of apparatus can be reduced and structure can be simplified considerably even when many kinds of power levels are used.

What is claimed is:

1. In a transmitting power control circuit of the type having an output level detector which detects transmitting output level and outputs a detected level signal depending on such transmitting output level, and a transmitting output control unit which controls said transmitting output level to a predetermined level in a specified range on the basis of said detected level signal and an output reference value specifying said predetermined level, a transmitting power control circuit comprising:

a reference value generating unit which generates output reference values corresponding to different higher and lower transmitting output levels within said specified range, and a control unit connected to said reference value generating unit for applying to said reference value generating unit an instruction to output the output reference value corresponding to the higher transmitting output level in the case where said transmitting signal is data signal, and an instruction to output the output reference value corresponding to the lower transmitting output level in the case where said transmitting signal is voice signal.

2. In a transmitting power control circuit of the type having an output level detector which detects transmitting output level of a transmitting output unit within a specified range among a plurality of power levels and outputs a signal level depending on such output level, and a transmitting output control unit which controls said output level to the predetermined power level value within the specified range on the basis of said detected level signal and an output reference value specifying said predetermined power level value, a transmitting power control circuit comprising:

a reference value generating unit which generates output reference values corresponding to higher and lower transmitting output levels within each specified range of a plurality of transmitting output power levels, said lower level of the next larger range of adjacent power levels overlapping the higher level of the next smaller range, and a control unit connected to said reference value generating unit for applying to said reference value generating unit an instruction to output the output reference value corresponding to the higher transmitting output level in the case where said transmitting signal is data signal or an instruction to output the output reference value corresponding to the lower output level in the case where said transmitted signal is voice signal.

* * * * *